US011961898B2

(12) United States Patent
Nguyen et al.

(10) Patent No.: US 11,961,898 B2
(45) Date of Patent: Apr. 16, 2024

(54) METHOD OF PATTERNING TWO-DIMENSIONAL MATERIAL LAYER ON SUBSTRATE, AND METHOD OF FABRICATING SEMICONDUCTOR DEVICE

(71) Applicant: Samsung Electronics Co., Ltd., Suwon-si (KR)

(72) Inventors: Van Luan Nguyen, Suwon-si (KR); Minsu Seol, Seoul (KR); Junyoung Kwon, Seoul (KR); Hyeonjin Shin, Suwon-si (KR); Minseok Yoo, Suwon-si (KR); Yeonchoo Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 187 days.

(21) Appl. No.: 17/546,303

(22) Filed: Dec. 9, 2021

(65) Prior Publication Data

US 2022/0238692 A1    Jul. 28, 2022

(30) Foreign Application Priority Data

Jan. 25, 2021  (KR) .......................... 10-2021-0010355

(51) Int. Cl.
*H01L 29/66* (2006.01)
*H01L 21/02* (2006.01)
(Continued)

(52) U.S. Cl.
CPC .. *H01L 29/66045* (2013.01); *H01L 21/02488* (2013.01); *H01L 21/02491* (2013.01);
(Continued)

(58) Field of Classification Search
CPC ......... H01L 29/66045; H01L 29/66969; H01L 29/1606; H01L 29/24; H01L 29/778;
(Continued)

(56) References Cited

U.S. PATENT DOCUMENTS 9,276,092 B1 * 3/2016 Karda ............... H01L 29/78681
9,490,430 B1 * 11/2016 Chen ................... H01L 29/4908
(Continued)

FOREIGN PATENT DOCUMENTS

JP      2008-159971 A    7/2008
KR     10-1364593 B1    2/2014
(Continued)

OTHER PUBLICATIONS

Deji Akinwande et al., "Graphene and two-dimensional materials for silicon technology", Nature vol. 573 (2019), pp. 507-518, https://doi.org/10.1038/s41586-019-1573-9.

*Primary Examiner* — Dale E Page
*Assistant Examiner* — Quovaunda Jefferson
(74) *Attorney, Agent, or Firm* — Harness, Dickey & Pierce, P.L.C.

(57) ABSTRACT

A method of patterning a 2D material layer is includes selectively forming a first material layer on a surface of a substrate to form a first region in which the first material layer covers the surface of the substrate and to further form a second region in which the surface of the substrate is exposed from the first material layer, the first material layer having a strong adhesive force with a 2D material. The method further includes forming a 2D material layer is formed in both the first region and the second region. The method further includes selectively removing the 2D material layer from the second region based on using a physical removal method, such that the 2D material layer remains in the first region.

20 Claims, 4 Drawing Sheets

(51) Int. Cl.
*H01L 21/304* (2006.01)
*H01L 21/463* (2006.01)

(52) U.S. Cl.
CPC .. *H01L 21/02527* (2013.01); *H01L 21/02568* (2013.01); *H01L 21/304* (2013.01); *H01L 21/463* (2013.01); *H01L 29/66969* (2013.01)

(58) Field of Classification Search
CPC ......... H01L 29/66742; H01L 21/02488; H01L 21/02491; H01L 21/02527; H01L 21/02568; H01L 21/304; H01L 21/463; H01L 21/02521; H01L 21/0259; H01L 21/02642; H01L 21/02645; H01L 21/02439; H01L 21/02587; H01L 21/02612
See application file for complete search history.

(56) References Cited

U.S. PATENT DOCUMENTS

| | | | | |
|---|---|---|---|---|
| 9,607,725 | B2 * | 3/2017 | Sandhu | ............ B82Y 30/00 |
| 10,600,646 | B2 | 3/2020 | Park et al. | |
| 10,804,102 | B2 | 10/2020 | Jang et al. | |
| 2015/0084013 | A1 * | 3/2015 | Ohmi | ............ H10K 10/462 |
| | | | | 257/40 |
| 2019/0074180 | A1 | 3/2019 | Park et al. | |
| 2021/0226010 | A1 | 7/2021 | Lee et al. | |
| 2021/0226011 | A1 | 7/2021 | Lee et al. | |
| 2021/0296445 | A1 | 9/2021 | Lee et al. | |

FOREIGN PATENT DOCUMENTS

| | | |
|---|---|---|
| KR | 10-2019-0026140 A | 3/2019 |
| KR | 10-2143058 B1 | 8/2020 |
| KR | 10-2021-0094330 A | 7/2021 |
| KR | 10-2021-0094332 A | 7/2021 |
| KR | 10-2021-0117004 A | 9/2021 |

* cited by examiner

METHOD OF PATTERNING TWO-DIMENSIONAL MATERIAL LAYER ON SUBSTRATE, AND METHOD OF FABRICATING SEMICONDUCTOR DEVICE

CROSS-REFERENCE TO RELATED APPLICATION

This application is based on and claims priority under 35 U.S.C. § 119 to Korean Patent Application No. 10-2021-0010355, filed on Jan. 25, 2021, in the Korean Intellectual Property Office, the disclosure of which is incorporated by reference herein in its entirety.

BACKGROUND

1. Field

The present inventive concepts relate to methods of patterning a two-dimensional (2D) material layer on a substrate and methods of manufacturing a semiconductor device.

2. Description of the Related Art

As the degree of integration of semiconductor devices increases, the size of semiconductor devices included in semiconductor apparatuses becomes smaller. In order to increase an operating speed of semiconductor devices, attempts have been made to reduce not only contact resistance between semiconductor devices, but also contact resistance between members or layers that constitute semiconductor devices (e.g., transistors). As part of this, a 2D material is employed. A 2D material has a high electron mobility compared to a three-dimensional (3D) material used in the related art. For example, a transistor employing a 2D material as a channel shows a high operating speed compared to a transistor using a 3D material as a channel.

In order to form a 2D material layer in a particular (or, alternatively, predetermined) region on a substrate, a photolithography process and a reactive ion etching (RIE) process are used.

SUMMARY

Provided are patterning methods capable of forming a 2D material layer of a uniform quality.

Provided are patterning methods efficient and capable of reducing contamination of a 2D material layer.

Provided are methods of manufacturing a semiconductor device capable of increasing a manufacturing yield.

Additional aspects will be set forth in part in the description which follows and, in part, will be apparent from the description, or may be learned by practice of some example embodiments of the inventive concepts.

According to some example embodiments, a method of patterning a two-dimensional (2D) material layer may include selectively forming a first material layer on a surface of a substrate to form a first region in which the first material layer covers the surface of the substrate and to further form a second region in which the surface of the substrate is exposed from the first material layer, the first material layer having a strong adhesive force with a 2D material, forming a 2D material layer in both the first region and the second region, and removing the 2D material layer from the second region based on using a physical removal method and not removing the 2D material layer from the first region, such that the 2D material layer remains exclusively in the first region.

The first material layer may include a metal layer. The metal layer may include at least one of copper, nickel, gold, or platinum.

The first material layer may include a metal oxide layer. The metal oxide layer may include at least one of $TiO_2$ or $HFO_2$.

The first material layer may include a self-assembled monolayer. The self-assembled monolayer may include at least one of a —$NH_2$ functional group or a —$SH_2$ functional group.

The 2D material layer may include at least one of graphene, black phosphorous, or transition-metal dichalcogenide.

The forming of both the first region and the second region may include forming, on the surface of the substrate in the second region, a second material layer having a weak adhesive force with respect to the 2D material. The second material layer may include at least one of Si, $SiO_2$, or $Al_2O_3$. The second material layer may include a self-assembled monolayer including at least one of a —$CF_3$ functional group or a —$CH_3$ functional group.

The physical removal method may include one of sonication or mechanical detachment.

According to some example embodiments, a method of manufacturing a semiconductor device may include selectively forming a first material layer on a surface of a substrate to form a first region in which the first material layer covers the surface of the substrate and to further form a second region in which the surface of the substrate is exposed from the first material layer, the first material layer having a strong adhesive force with a two-dimensional (2D) material, forming a 2D material layer having a layered structure of a 2D material in both the first region and the second region, forming a channel layer based on removing the 2D material layer from the second region based on using a physical removal method and not removing the 2D material layer from the first region, such that the 2D material layer remains exclusively in the first region, forming a first electrode and a second electrode, wherein the first electrode and the second electrode are each in direct contact with the channel layer and are isolated from direct contact with each other, and forming a third electrode extending in parallel with the channel layer.

The two-dimensional material layer may include at least one of graphene, black phosphorous, or transition-metal dichalcogenide. The first material layer may be one of a metal layer including at least one of copper, nickel, gold, or platinum, a metal oxide layer including at least one of $TiO_2$ or $HfO_2$, or a self-assembled monolayer including at least one of a —$NH_2$ functional group or a —$SH_2$ functional group.

The forming of both the first region and the second region may include forming, on the surface of the substrate in the second region, a second material layer having a weak adhesive force with respect to the 2D material. The 2D material layer may include at least one of graphene, black phosphorous, or transition-metal dichalcogenide. The second material layer may include at least one of Si, $SiO_2$, or $Al_2O_3$. The second material layer may include a self-assembled monolayer including at least one of a —$CF_3$ functional group or a —$CH_3$ functional group.

The physical removal method may include one of sonication or mechanical detachment.

BRIEF DESCRIPTION OF THE DRAWINGS

The above and other aspects, features, and advantages of some example embodiments of the inventive concepts will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, some example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Hereinafter, patterning methods of a 2D material layer and manufacturing methods of a semiconductor device will be described in detail with reference to the accompanying drawings. The widths and thicknesses of layers and regions shown in the accompanying drawings may be exaggerated for convenience of explanation and clarity of the specification. Like reference numerals refer to like elements throughout detailed descriptions.

Figure 1A:
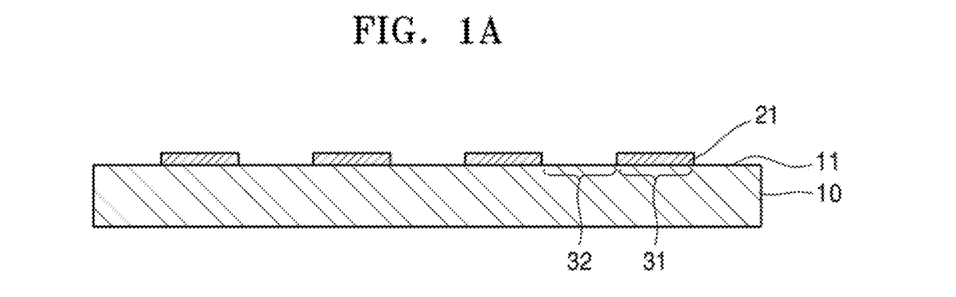
FIGS. 1A, 1B, and 1C are diagrams showing a method of patterning a 2D material layer according to some example embodiments.
Figure 1B:
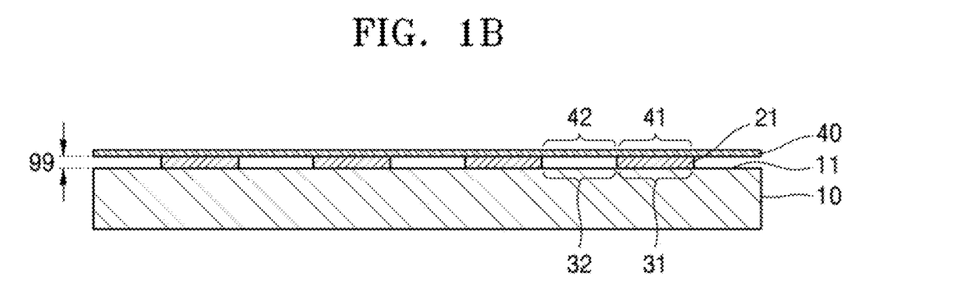
Figure 1C:
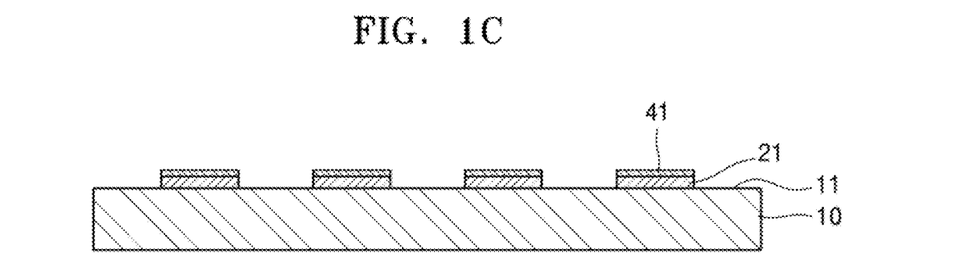

FIGS. 1A to 1C are diagrams showing a method of patterning a two-dimensional (2D) material layer according to some example embodiments. Referring to FIGS. 1A to 1C, a method of patterning a 2D material layer, according to some example embodiments includes forming a first region 31 on which a first material layer 21 having strong adhesion to a 2D material is formed on a surface 11 of a substrate 10 and a second region 32 on which the first material layer 21 is not formed; forming a 2D material layer 40 in the first region 31 and the second region 32; and removing a 2D material layer 42 in the second region 32 based on using a physical removal method (non-photolithography process) and remaining a 2D material layer 41 in the first region 31.

First, referring to FIG. 1A, the substrate 10 is prepared. The substrate 10 may be a semiconductor substrate, an insulating substrate, and a semiconductor substrate with an insulating layer formed on a surface 11 of the substrate 10, and is not limited thereto. The semiconductor substrate may include, for example, Si, GE, SiGe or a Group III-V semiconductor material, and the like. For example, the substrate 10 may be a silicon substrate on which a silicon oxide is formed.

The first material layer 21 is formed in the first region 31 of the substrate 10. The second region 32 is a region of the surface 11 of the substrate 10 on which the first material layer 21 is not formed. Restated, the preparation of the substrate 10 as shown in FIG. 1A may include selectively forming the first material layer 21 on the surface 11 of the substrate 10 to establish (e.g., form, define, etc.) the first region 31 as a region in which the first material layer 21 covers the surface 11 of the substrate 10 and to further establish (e.g., form, define, etc.) the second region 32 as a region in which the surface 11 of the substrate 10 is exposed from (e.g., not covered by) the first material layer 21. The first material layer 21 has adhesiveness with respect to the 2D material (e.g., a strong adhesive force with the 2D material). For example, the adhesion between the first material layer 21 and the 2D material is greater than the adhesion between the 2D material and the surface 11 of the substrate 10.

In some example embodiments, the first material layer 21 may include a metal layer. The metal layer may be formed by depositing a metal onto the surface 11 (e.g., insulating surface) of the substrate 10. A metal having adhesive force with respect to the 2D material greater than the adhesive force between the 2D material and the surface 11 (e.g., insulating surface) of the substrate 10 is used as the metal. For example, the metal may include at least one of copper (Cu), nickel (Ni), gold (Au), or platinum (Pt). The first material layer 21 may be a single metal thin film and may be a thin film including two or more metals, and may be a multilayer metal thin film including different metals from each other.

In some example embodiments, the first material layer 21 may include a metal oxide having an insulating property. A metal oxide having adhesive force with respect to a 2D material greater than the adhesive force between the 2D material and the surface 11 (e.g., insulating surface) of the substrate 10 may be used as the metal oxide. The metal oxide may be a high-k dielectric material having a high dielectric constant. For example, the metal oxide may include at least one of $TiO_2$ or $HfO_2$. The first material layer 21 may be a layer including a single metal oxide, may be a layer including two or more metal oxides, and/or may be a multilayer structure including different metal oxides from each other. Accordingly, the first material layer may include a metal oxide layer that may include any of the metal oxides described herein (e.g., at least one of $TiO_2$ or $HfO_2$). The method of forming the first material layer 21 is not particularly limited. For example, the first material layer 21 may be formed based on using a sputtering method, an atomic layer deposition (ALD) method, etc.

In some example embodiments, the first material layer 21 may include a self-assembled monolayer (SAM). The SAM refers to an organic monolayer that is spontaneously formed on a surface of a solid. The SAM includes a head group, a hydrocarbon chain, and a terminal group. The head group is chemically adsorbed on a surface of a solid to form monolayers. The hydrocarbon chain allows the monolayers to be aligned by the Van der Waals interaction. The terminal group includes functional groups. The functional groups are part of the SAM that enables application of the SAM, and in some example embodiments, an SAM having functional groups having adhesive force with respect to a 2D material is employed. For example, a self-assembled monolayer having (e.g., including) at least one of a $-NH_2$ functional group or a $-SH_2$ functional group may be employed as an insulating material layer. Restated, the self-assembled monolayer of the first material layer 21 may have (e.g., may include) at least one of a $-NH_2$ functional group or a $-SH_2$ functional group. If only an ionic bond exists between the surface 11 of the substrate 10 and the first material layer 21, it is difficult to form a strong molecular film. However, in the case of the self-assembled monolayer, because a chemical bond is formed between the surface 11 of the substrate 10 and the molecules of the head group constituting the monolayer, a very strong molecular film, that is, the first material layer 21, may be formed. Also, the functional group of the monolayer and the 2D material may be combined with strong adhesive force. Accordingly, as a result, the self-assembled monolayer is strongly bonded to the surface 11 of the substrate 10 and the 2D material layer, and thus, the adhesive force of the 2D material layer may be enhanced.

Next, referring to FIG. 1B, a 2D material layer 40 is formed in both the first region 31 and the second region 32. The 2D material layer 40 may be formed on (e.g., directly and/or indirectly on) an entire surface 11 of the substrate 10 including the first region 31 and the second region 32. In FIG. 1B, the 2D material layer 40 is shown to be separated from (e.g., isolated from direct contact with) the surface 11 of the substrate 10 in the second region 32 (e.g., the first material layer 21 is directly or indirectly between the 2D material layer 40 and the substrate 10 in the first region 31 but not in the second region 32), but the 2D material layer 40 may be formed on the surface 11 of the substrate 10. Also, the thickness of a 2D material layer 41 of the first region 31 and the thickness of a 2D material layer 42 of the second region 32 may be the same. The thickness of the 2D material layer 41 of the first region 31 and the thickness of the 2D material layer 42 of the second region 32 may be different from each other. For example, the thickness of the 2D material layer 41 of the first region 31 may be greater than that of the 2D material layer 42 of the second region 32. As shown in FIG. 1B, in some example embodiments, the 2D material layer 42 of the second region 32 may be isolated from direct contact with the surface 11 of the substrate 10 by a space 99. In some example embodiments, space 99 is partially or completely filled with a material (e.g., second material layer 22 as described herein) that may be different from both the material of the first material layer 21 and the material of the 2D material layer 40, such that the 2D material layer 42 of the second region 32 may be isolated from direct contact with the surface 11 of the substrate 10 by the second material layer 22. In some example embodiments, space 99 may be absent and the 2D material layer 42 of the second region 32 may be in direct contact with the surface 11 of the substrate 10 in the second region 32.

The 2D material refers to a semiconductor material having a 2D crystal structure. The 2D material layer may have a layered structure of the 2D material. The 2D material may have a layered structure of a monolayer or a multilayer. Each layer constituting the 2D material may have a thickness of an atomic level. The 2D material of the 2D material layer 40 may include, for example, at least one of graphene, black phosphorous, or transition-metal dichalcogenide (TMD). Restated, the 2D material layer 40 (and thus the 2D material layers 41 and 42) may include at least one of graphene, black phosphorous, or transition-metal dichalcogenide (TMD). Graphene is a material having a hexagonal honeycomb structure formed by two-dimensionally bonding of carbon atoms, and has the advantages of high electrical mobility, high thermal properties, chemical stability, and having a large surface area compared to silicon (Si). The black phosphorous is a substance in which black phosphorous atoms are two-dimensionally bonded.

The TMD may include, for example, one transition-metal of Mo, W, Nb, V, Ta, Ti, Zr, Hf, Tc, and Re and one chalcogen element of S, Se, and Te. The TMD may be expressed as, for example, $MX_2$, wherein M represents a transition-metal and X represents a chalcogen element. For example, M may be Mo, W, Nb, V, Ta, Ti, Zr, Hf, Tc, Re, and the like, and X may be S, Se, Te, and the like. Accordingly, for example, TMD may include $MoS_2$, $MoSe_2$, $MoTe_2$, $WS_2$, $WSe_2$, $WTe_2$, $ZrS_2$, $ZrSe_2$, $HfS_2$, $HfSe_2$, $NbSe_2$, $ReSe_2$, and the like. Alternatively, the TMD may not be expressed as $MX_2$. In this case, for example, the TMD may include CuS which is a compound of Cu which is a transition-metal and S which is a chalcogen element. On the other hand, the TMD may be a chalcogenide material including a non-transition-metal. The non-transition-metal may include, for example, Ga, in, Sn, Ge, Pb, and the like. In this case, the TMD may include a compound of a nontransition-metal, such as Ga, In, Sn, Ge, and Pb and a chalcogen element, such as S, Se, and Te. For example, the TMD may include $SnSe_2$, GaS, GaSe, GaTe, GeSe, $In_2Se_3$, $InSnS_2$, and the like.

As described above, the TMD may include one of metal elements, such as Mo, W, Nb, V, Ta, Ti, Zr, Hf, Tc, Re, Cu, Ga, In, Sn, Ge, and/or Pb and one of chalcogen element, such as S, Se, and/or Te. However, the materials mentioned above are merely examples, and other materials may also be used as a TMD material.

The 2D material may be doped with a p-type dopant or an n-type dopant to control the mobility of the 2D material. Here, the p-type dopant and n-type dopant may be, for example, a p-type dopant and an n-type dopant used for graphene or CNTs. The p-type dopant or the n-type dopant may be doped based on using an ion implantation method, a chemical doping method, or a substitutional doping method. The substitutional doping refers to that a heterogeneous metal of the TMD is substituted with some dopants. The TMD doped in this form includes, for example, Nb-doped $MoS_2$, Re-doped $MoS_2$, V-doped $MoS_2$, etc.

The 2D material layer 40 may further include an intercalation material inserted into an interlayer of a 2D material, and here, the intercalation material may include, for example, lithium (Li) or potassium (K), etc. For example, the intercalation material may include Li atoms, include K atoms, or include both Li atoms and K atoms. The carrier mobility (for example, electron mobility) in a thickness direction of the 2D material layer 40 may be increased by the intercalation material, and as a result, the performance and operation characteristics of the semiconductor device may be improved. A semiconductor device having a vertical-type structure using a 2D material may exhibit a relatively high current density even at a low input voltage compared to a horizontal type semiconductor device, and thus, may be used as a low power semiconductor device. Also, because a 2D material may have a small thickness and, in a vertical-type semiconductor device, a short channel of several tens of nm or less may be readily implemented, the manufacturing process of the semiconductor device is easy, and a high-density integrated circuit may be implemented due to the small device size.

The 2D material layer 40 may be formed by, for example, a growth method, a transfer method, or the like. As an example, the process of forming the 2D material layer 40 based on using a transfer method will be briefly described.

First, a 2D material layer is grown on a growth substrate. The growth may be performed, for example, based on using an organometallic chemical vapor deposition (MOCVD), an atomic layer deposition (ALD), etc. As needed, a process of doping the 2D material layer with a p-type dopant or an n-type dopant may be performed. Here, the p-type dopant and n-type dopant may be, for example, a p-type dopant and an n-type dopant used for graphene or carbon nanotubes (CNTs). The p-type dopant or the n-type dopant may be doped based on using an ion implantation method, a chemical doping method, or a substitutional doping method, etc. A source of the p-type dopant may include an ionic liquid, such as $NO_2BF_4$, $NOBF_4$, $NO_2SbF_6$, etc. an acidic compound, such as HCl, $H_2PO_4$, $CH_3COOH$, $H_2SO_4$, $HNO_3$, etc. and an organic compound, such as dichlorodicyanoquinone (DDQ), oxone, dimristoylphosphatidylinositol (DMPI), trifluoromethaneimide (DMPI), etc. Alternatively, the source of the p-type dopant may include $HPtCl_4$, $AuCl_3$, $HAuCl_4$, silver trifluoromethaesulfonate (AgOTf), $AgNO_3$, $H_2PdCl_6$, $Pd(OAc)_2$, $Cu(CN)_2$, etc. A source of the n-type dopant may include, for example, a reduction product of a substituted or unsubstituted nicotinamide; a reduction product of a compound which is chemically bound to a substituted or unsubstituted nicotinamide; and a compound including at least two pyridinium derivatives in which a nitrogen atom of at least one of the pyridinium derivative is reduced. For example, the source of the n-type dopant may include nicotinamide mononucleotide-H (NMNH), nicotinamide adenine dinucleotide-H (NADH), nicotinamide adenine dinucleotide phosphate-H (NADP), or viologen. Alternatively, the source of the n-type dopant may include a polymer, such as polyethylenimine (PEI), etc. Alternatively, the n-type dopant may include an alkali metal, such as K and Li. The p-type dopant materials and the n-type dopant materials mentioned above are examples, and other various other substances may be used as a dopant.

Then, a carrier polymer layer is formed on an upper surface of the 2D material layer, and the carrier polymer layer and the 2D material layer are separated from the growth substrate. The carrier polymer layer and the 2D material layer are attached to the first region 31 and the second region 32 of the substrate 10 and the carrier polymer layer is removed.

As a result, as shown in FIG. 1B, the 2D material layer 40 may be formed on both the first region 31 and the second region 32. In the first region 31, a 2D material layer 41 is formed on the first material layer 21. The first material layer 21 has a strong adhesive force with the 2D material layer 41. Thus, in a process of removing the carrier polymer layer, the 2D material layer 41 may be maintained (e.g., may remain) on the first material layer 21 without peeling-off from the first material layer 21. Therefore, the 2D material layer 41 of stable quality may be formed.

Next, referring to FIG. 1C, a 2D material layer 42 of the second region 32 is removed (e.g., selectively removed) based on using a physical removal method, and the 2D material layer 41 of the first region 31 is not removed such that the 2D material layer 41 of the first region 31 is left (e.g., remains exclusively on the surface 11 of the substrate 10 in the first region 31 and thus is not on the surface 11 of the substrate 10 at all in the second region 32). The physical removal method may include a non-photolithography process, for example, sonication, mechanical detachment, etc. For example, the physical removal method may comprise one of sonication or mechanical detachment. For example, the sonication may be performed in acetone.

As described above, a surface of the first material layer 21 is strongly adhered to the 2D material layer 41 in the first region 31. The adhesive force between the first material layer 21 and the 2D material layer 41 is greater than the adhesive force between the substrate 10 and the 2D material layer 42 in the second region 32. Accordingly, in the physical removal method, the 2D material layer 41 in the first region 31 is not separated from the first material layer 21 and thus at least partially remains in the first region 31, and the 2D material layer 42 in the second region 32 is peeled-off and removed from the substrate 10. Thus, as shown in FIG. 1C, the 2D material layer 40 may be selectively removed from the second region 32 based on using a physical removal method, such that the 2D material layer 40 remains (e.g., exclusively remains) in the first region 31. Restated, the selective removal of the 2D material layer may include removing the 2D material layer 42 from the second region 32 but not removing the 2D material layer 41 from the first region 31 so that the 2D material layer 41 remains exclusively in the first region 31 on the substrate 10 (e.g., directly on the first material layer 21). Accordingly, as shown in FIG. 1C, a patterned 2D material layer 41 in a form in which the first material layer 21 and the 2D material layer 41 are sequentially stacked on the first region 31 of the substrate 10 may be obtained.

According to an existing process in which a 2D material layer 40 is formed on an entire surface 11 of the substrate 10 and the 2D material layer 42 is patterned based on using a photolithography process, the process may take a long time, and contamination of the 2D material layer 42 may be caused by residual photoresist. Also, a toxic substance, for example, SF6, etc. may be used in a reactive ion etching process.

In the patterning method according to some example embodiments, the 2D material layer is patterned based on using an adhesive force difference between the adhesive force between the 2D material layer 40 and the first material layer 21 and the adhesive force between the 2D material layer 40 and the substrate 10, and thus, the patterning process may take less time than the photolithography process, and contamination of the 2D material layer 41 after patterning may be reduced or prevented. Also, because the 2D material layer 42 of the second region 32 is removed based on a physical removal method, not based on a reactive ion etching process, the process of using a toxic material may be reduced or eliminated. Further, because the 2D material layer 41 of the first region 31 is strongly adhered to the first material layer 21, a 2D material layer of a uniform quality may be formed, and the process yield may be improved.

Figure 2A:
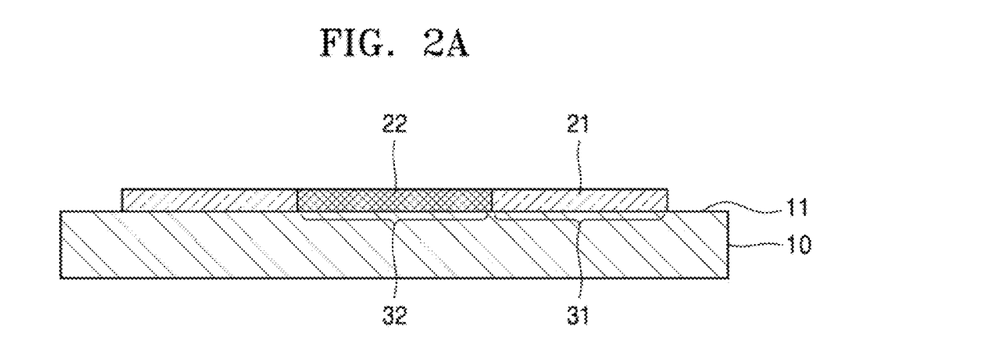
FIGS. 2A, 2B, and 2C are diagrams showing a method of patterning a 2D material layer according to some example embodiments.
Figure 2B:
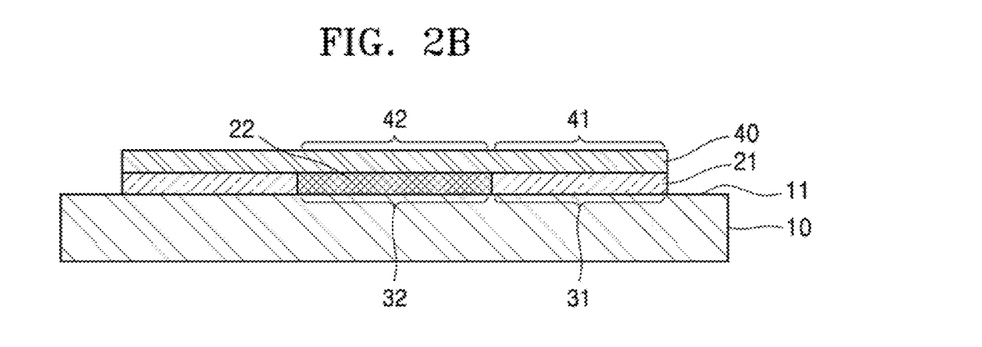
Figure 2C:
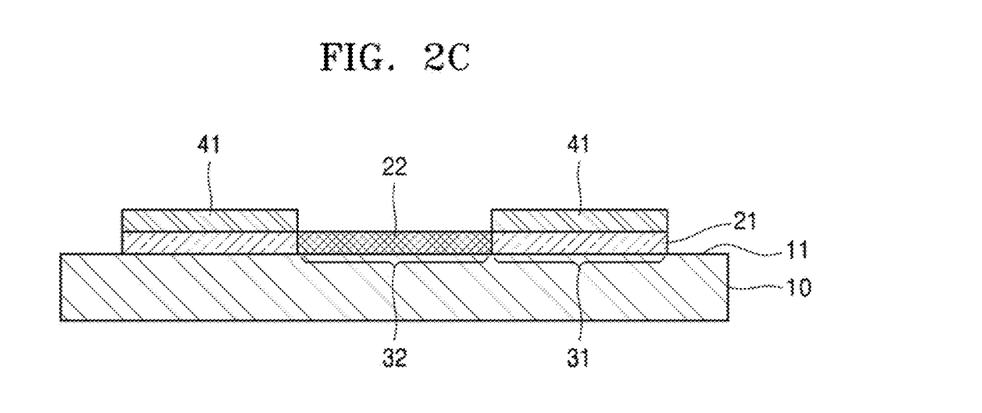

FIGS. 2A to 2C are diagrams showing a method of patterning a 2D material layer according to some example embodiments. Referring to FIGS. 2A to 2C, the method of patterning a 2D material layer according to some example embodiments is different from the patterning method shown in FIGS. 1A to 1C in that the patterning method according to some example embodiments includes forming a second material layer 22 having a weak adhesive force with respect to a 2D material on (e.g., directly or indirectly on) the surface 11 of the substrate 10 in the second region 32. Hereinafter, the differences will be mainly described, and redundant descriptions will be omitted.

First, referring to FIG. 2A, a first material layer 21 is formed on the surface 11 of the substrate 10 in the first region 31 of the surface 11 of the substrate 10 and a second material layer 22 is formed on the surface 11 of the substrate 10 in the second region 32 of the surface 11 of the substrate 10. Adhesive force between the second material layer 22 and the 2D material is less than the adhesive force between the 2D material and the first material layer 21. The adhesive force between the second material layer 22 and the 2D material of the 2D material layer 40 may be less than the adhesive force between the 2D material of the 2D material layer 40 and the surface 11 of the substrate 10. The second material layer 22 includes a material having a small adhesive force with the 2D material (e.g., a weak adhesive force with respect to the 2D material of the 2D material layer 40).

In some example embodiments, the second material layer 22 may include at least one of Si, $SiO_2$, or $Al_2O_3$. The second material layer 22 may be a layer including one of Si, $SiO_2$ or $Al_2O_3$, and may be a layer including two or more of Si, $SiO_2$ and/or $Al_2O_3$. The second material layer 22 may have a multilayer structure including different materials in Si, $SiO_2$ and/or $Al_2O_3$.

In some example embodiments, the second material layer 22 may include a self-assembled monolayer (SAM) having a functional group having a weak bonding force with a 2D material. For example, the second material layer 22 may include a SAM having (e.g., including) at least one of a —$CF_3$ functional group or a —$CH_3$ functional group.

Next, as shown in FIG. 2B, a 2D material layer 40 is formed on the substrate 10. The 2D material layer 40 may be formed based on using a growth method, a transfer method, etc. as described above. The 2D material layer 40 includes a 2D material layer 41 on the first material layer 21 and a 2D material layer 42 on the second material layer 22.

Next, as shown in FIG. 2C, the 2D material layer 42 on the second material layer 22 is removed (e.g., selectively removed) based on using a physical removal method and the 2D material layer 41 on the first material layer 21 is left (e.g., remains in the first region 31). As described above, the 2D material layer 41 is strongly adhered to the first material layer 21. On the other hand, the adhesive force between the 2D material layer 42 and the second material layer 22 is relatively weak. Accordingly, in the physical removal operation, the 2D material layer 41 of the first region 31 is not separated from the first material layer 21, and the 2D material layer 42 of the second region 32 is peeled-off and removed from the second material layer 22. Accordingly, as shown in FIG. 2C, a patterned 2D material layer 41 in a form in which the first material layer 21 and the 2D material layer 41 are sequentially stacked on the first region 31 of the substrate 10 may be obtained. The second material layer 22 may be left (e.g., may remain on the surface 11 of the substrate 10 in the second region 32) and may be removed as needed.

The method of patterning the 2D material layer described above may be applied to a method of manufacturing semiconductor devices, for example, field effect transistors in various forms.

Figure 3A:
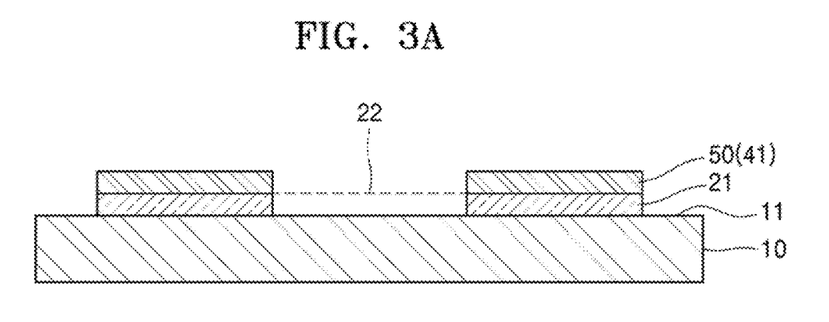
FIGS. 3A, 3B, and 3C are diagrams showing a method of manufacturing a semiconductor device according to some example embodiments.
Figure 3B:
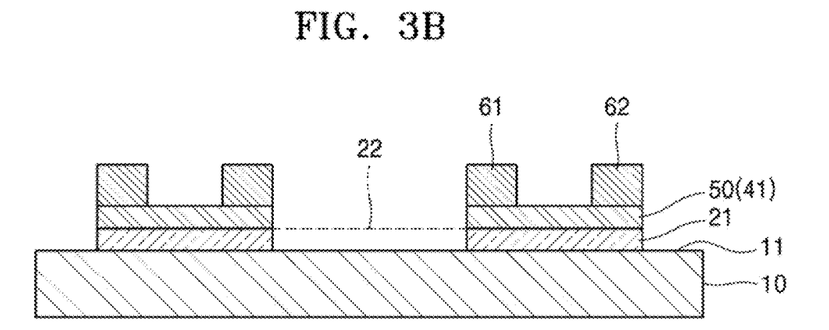
Figure 3C:
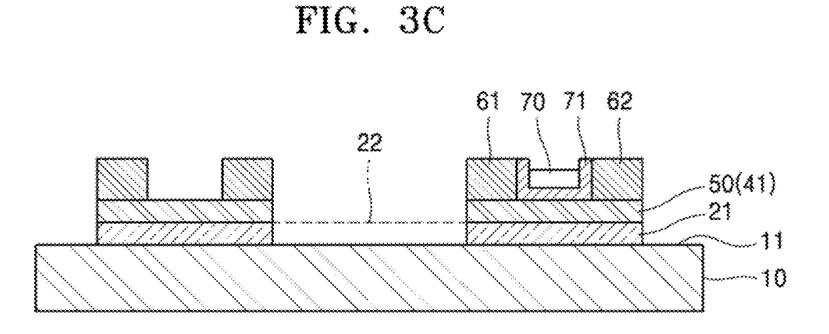

FIGS. 3A to 3C are diagrams showing a method of manufacturing a semiconductor device according to some example embodiments.

First, referring to FIG. 3A, a channel layer 50 having a layered structure of a 2D material is formed on the substrate 10. The channel layer 50 may be formed by the method shown in FIGS. 1A to 1C or by the method shown in FIGS. 2A to 2C (e.g., selectively removing the 2D material layer 42 from the second region 32 based on using a physical removal method, such that the 2D material layer 41 remains in the first region 31). For example, the patterned 2D material layer 41 in which the first material layer 21 and the 2D material layer 41 are sequentially stacked on the substrate 10 is formed by the method shown in FIGS. 1A to 1C or by the method shown in FIGS. 2A to 2C. The 2D material layer 41 will be the channel layer 50. According to the method shown in FIGS. 2A to 2C, the second material layer 22 may remain on the substrate 10 as shown in the dashed line in FIG. 3A. The substrate 10 may be an insulating substrate or a semiconductor substrate in which an insulating layer is formed on the surface 11 of the substrate 10, but is not limited thereto. The semiconductor substrate may include, for example, Si, Ge, SiGe or a Group III-V semiconductor material, and the like. For example, the substrate 10 may include a silicon substrate including a silicon oxide.

Next, as shown in FIG. 3B, a first electrode 61 and a second electrode 62 are formed. The first electrode 61 and the second electrode 62 may each contact (e.g., may each be in direct contact with, may each independently directly contact, etc.) the channel layer 50 and separate from each other (e.g., are isolated from direct contact with each other). The first electrode 61 and the second electrode 62 are a source electrode and a drain electrode, respectively. As an example, the first electrode 61 and the second electrode 62 may be formed on the channel layer 50. In some example embodiments, the first electrode 61 and the second electrode 62 may include a metal material having high electrical conductivity. For example, the first electrode 61 and the second electrode 62 may include a metal, such as magnesium (Mg), aluminum (Al), scandium (Sc), titanium (Ti), vanadium (V), chrome (Cr), manganese (Mn), nickel (Ni), copper (Cu), zinc (Zn), gallium (Ga), zirconium (Zr), niobium (Nb), molybdenum (Mo), lead (Pb), silver (Ag), cadmium (Cd), indium (In), tin (Sn), lanthanum (La), hafnium (Hf), tantalum (Ta), tungsten (W), iridium (Ir), platinum (Pt), gold (Au), bismuth (Bi), etc. or an alloy of these metals.

Next, referring to FIG. 3C, a third electrode 70 facing the channel layer 50 (e.g., extending in parallel with the channel layer 50) is formed with the insulating layer 71 therebetween. The third electrode 70 may be a gate electrode. In some example embodiments, the third electrode 70 is formed on the channel layer 50. First, the insulating layer 71 is formed on the channel layer 50. The insulating layer 71 is a gate insulating film that blocks a leakage current between the channel layer 50 and the third electrode 70. The insulating layer 71 also insulates between the third electrode 70 and the first electrode 61 and between the third electrode 70 and the second electrode 62. Next, the third electrode 70 is formed on the insulating layer 71.

The insulating layer 71 may include a high-k dielectric material having a high dielectric constant. The insulating layer 71 may include, for example, aluminum oxide, hafnium oxide, zirconium hafnium oxide, lanthanum oxide, etc. However, it is not limited thereto. The third electrode 70 may include a metal material or a conductive oxide. Here, the metal material may include, for example, at least one selected from the group consisting of Au, Ti, Ti, TiN, TaN, W, Mo, Wn, Pt and Ni. The conductive oxide may include, for example, indium tin oxide (ITO), indium zinc oxide (IZO), etc. The third electrode 70 may include the same material as the first electrode 61 and the second electrode 62.

According to the method of manufacturing the semiconductor device described above, the first material layer 21 is strongly adhered to the 2D material layer 41 formed on a surface of the first material layer 21. Because the adhesive force between the first material layer 21 and the 2D material layer 41 is large, the peeling-off of the 2D material layer 41 in a process of transferring the 2D material layer 41 may be prevented. The adhesive force between the first material layer 21 and the 2D material layer 41 is greater than the adhesive force between the substrate 10 and the 2D material layer 42 in the second region 32 or the adhesive force between the second material layer 22 and the 2D material layer 42 in the second region 32. In the physical removal process, the 2D material layer 41 of the first region 31 is not separated from the first material layer 21, and the 2D material layer 42 of the second region 32 is peeled-off and removed from the substrate 10. Accordingly, the uniform quality channel layer 50 in a form in which the first material layer 21 and the 2D material layer 41 are sequentially stacked on the first region 31 of the substrate 10 may be obtained, and the process yield of the semiconductor device may be improved.

Further, the process time is less than the photolithography process of the related art, and the contamination of the channel layer 50 after patterning may be reduced or prevented. Also, because a physical removal method is used, not a reactive ion etching process, the process of using a toxic material may be reduced or eliminated.

According to the channel layer 50 including a 2D material, the performance and operation characteristics of the semiconductor device may be improved. A semiconductor device having a vertical-type structure using a 2D material may exhibit a relatively high current density even at a low input voltage compared to a horizontal type semiconductor device, and thus, may be used as a low power semiconductor device. Also, because a 2D material may have a small thickness and, in a vertical-type semiconductor device, a short channel of several tens of nm or less may be readily implemented, a manufacturing process of the semiconductor device is easy, and a high-density integrated circuit may be implemented due to the small device size.

Figure 4A:
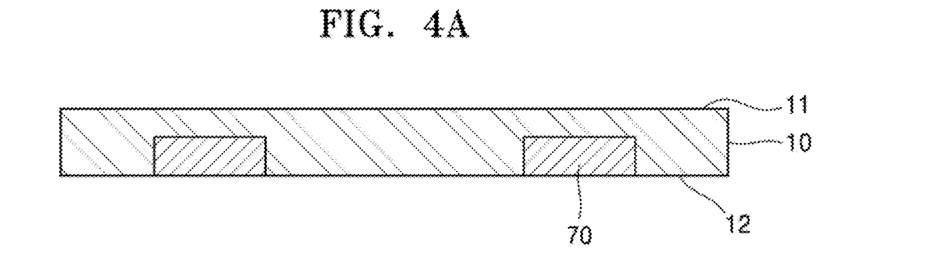
FIGS. 4A, 4B, and 4C are diagrams showing a method of manufacturing a semiconductor device according to some example embodiments.
Figure 4B:
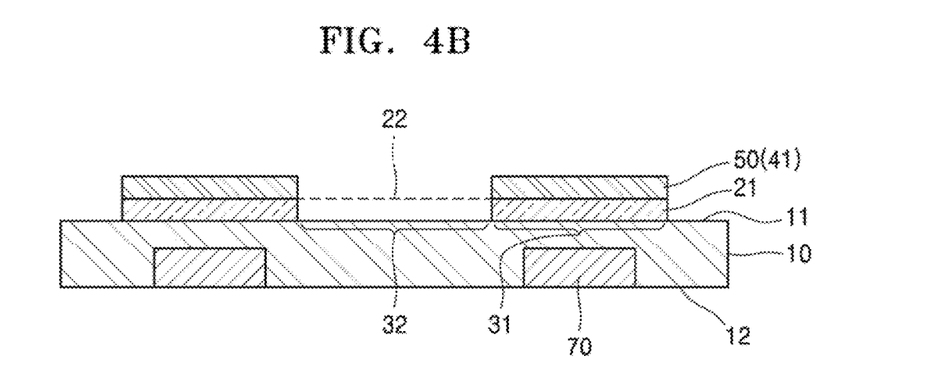
Figure 4C:
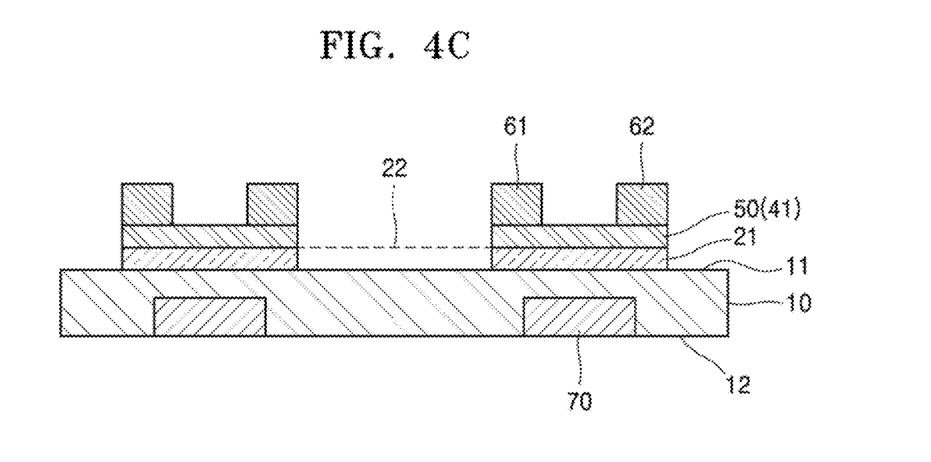

FIGS. 4A to 4C are diagrams showing a method of manufacturing a semiconductor device according to some example embodiments.

First, referring to FIG. 4A, a substrate 10 having a third electrode 70 (e.g., gate electrode) is prepared. The substrate 10 may be an insulating substrate or a semiconductor substrate in which an insulating layer is formed on the surface 11 (which may be an insulating surface) of the substrate 10, but is not limited thereto. The semiconductor substrate may include, for example, Si, Ge, SiGe or a Group III-V semiconductor material, and the like. For example, the substrate 10 may include a silicon substrate including a silicon oxide. The third electrode 70 may be formed to be inwardly sunken from a rear surface 12 which is opposite to the surface 11 of the substrate 10 and exposed through the rear surface 12. The third electrode 70 may be formed on the rear surface 12 of the substrate 10.

Next, as shown in FIG. 4B, a channel layer 50 is formed. The channel layer 50 is formed to face the third electrode 70. The channel layer 50 may be formed based on using the method shown in FIGS. 1A to 1C or the method shown in FIGS. 2A to 2C. In this case, a region of the substrate 10 facing the third electrode 70 in a thickness direction may be the first region 31 where the channel layer 50 is to be formed. A patterned 2D material layer 41 in which the first material layer 21 and the 2D material layer 41 are sequentially stacked is formed on the substrate 10 based on using the method shown in FIGS. 1A to 1C or the method shown in FIGS. 2A to 2C. The 2D material layer 41 becomes the channel layer 50. According to the method shown in FIGS. 2A to 2C, as shown by the dashed line in FIG. 4B, the second material layer 22 may remain on the substrate 10. The surface 11 (e.g., insulating surface) of the substrate 10 may function as a gate insulating film that suppresses a leakage current by insulating the channel layer 50 from the third electrode 70.

Next, as shown in FIG. 4C, the first electrode 61 and the second electrode 62 are formed. The first electrode 61 and the second electrode 62 may contact the channel layer 50 and may be separated from each other. The first electrode 61 and the second electrode 62 are a source electrode and a drain electrode, respectively. As an example, the first electrode 61 and the second electrode 62 may be formed on the channel layer 50.

Because a material that is strongly adhered to a 2D material is used, a uniform quality 2D material layer may be formed in a particular (or, alternatively, predetermined) region on a substrate.

Because a photolithography process is not applied in a process of patterning the 2D material layer, the patterning process is efficient and contamination of the 2D material layer may be reduced.

In a process of manufacturing a semiconductor device, the peeling-off of the 2D material layer may be reduced or prevented, and thus, the manufacturing yield of the semiconductor device may be improved.

A semiconductor device having high performance and operation characteristics with high carrier mobility may be manufactured.

While some example embodiments have been described in detail, the scope of the inventive concepts is not defined by the detailed descriptions but by the appended claims.

It should be understood that example embodiments described herein should be considered in a descriptive sense only and not for purposes of limitation. Descriptions of features or aspects within each example embodiment should typically be considered as available for other similar features or aspects in other example embodiments. While some example embodiments have been described with reference to the figures, it will be understood by those of ordinary skill in the art that various changes in form and details may be made therein without departing from the spirit and scope as defined by the following claims.

What is claimed is:

1. A method of patterning a two-dimensional (2D) material layer, the method comprising:
   selectively forming a first material layer on a surface of a substrate to form a first region in which the first material layer covers the surface of the substrate and to further form a second region in which the surface of the substrate is exposed from the first material layer;
   forming a 2D material layer including a 2D material at in both the first region and the second region, wherein an adhesive force between the 2D material and the first material layer in the first region is greater than an adhesive force between the 2D material and a separate material in the second region; and
   removing the 2D material layer from the second region based on using a physical removal method and not removing the 2D material layer from the first region, such that the 2D material layer remains exclusively in the first region, based on the adhesive force between the 2D material and the first material layer in the first region being greater than the adhesive force between the 2D material and the separate material in the second region.

2. The method of claim 1, wherein the first material layer includes a metal layer.

3. The method of claim 2, wherein the metal layer includes at least one of copper, nickel, gold, or platinum.

4. The method of claim 1, wherein the first material layer comprises a metal oxide layer.

5. The method of claim 4, wherein the metal oxide layer comprises at least one of $TiO_2$ or $HFO_2$.

6. The method of claim 1, wherein the first material layer comprises a self-assembled monolayer.

7. The method of claim 6, wherein the self-assembled monolayer includes at least one of a —$NH_2$ functional group or a —$SH_2$ functional group.

8. The method of claim 1, wherein the 2D material layer comprises at least one of graphene, black phosphorous, or a transition-metal dichalcogenide.

9. The method of claim 1, wherein the forming of both the first region and the second region includes forming, on the surface of the substrate in the second region, a second material layer having a weak adhesive force with respect to the 2D material.

10. The method of claim 9, wherein the second material layer comprises at least one of Si, $SiO_2$, or $Al_2O_3$.

11. The method of claim 9, wherein the second material layer comprises a self-assembled monolayer including at least one of a —$CF_3$ functional group or a —$CH_3$ functional group.

12. The method of claim 1, wherein the physical removal method comprises one of sonication or mechanical detachment.

13. A method of manufacturing a semiconductor device, the method comprising:
   selectively forming a first material layer on a surface of a substrate to form a first region in which the first material layer covers the surface of the substrate and to further form a second region in which the surface of the substrate is exposed from the first material layer;
   forming a 2D material layer having a layered structure of a two-dimensional (2D) material in both the first region and the second region, wherein an adhesive force between the 2D material and the first material layer in the first region is greater than an adhesive force between the 2D material and a separate material in the second region;
   removing the 2D material layer from the second region based on using a physical removal method, and not removing the 2D material layer from the first region, such that the 2D material layer remains exclusively in the first region, based on the adhesive force between the 2D material and the first material layer in the first region being greater than the adhesive force between the 2D material and the separate material in the second region, wherein the 2D material layer that remains exclusively in the first region;
   forming a channel layer based on the removing the 2D material layer from the second region based on using the physical removal method, wherein the channel layer includes the 2D material layer that remains exclusively in the first region;

forming a first electrode and a second electrode, wherein the first electrode and the second electrode are each in direct contact with the channel layer and are isolated from direct contact with each other; and forming a third electrode extending in parallel with the channel layer.

14. The method of claim 13, wherein the 2D material layer comprises at least one of graphene, black phosphorous, or a transition-metal dichalcogenide.

15. The method of claim 14, wherein the first material layer is one of:

a metal layer including at least one of copper, nickel, gold, or platinum;

a metal oxide layer including at least one of $TiO_2$ or $HfO_2$; or a self-assembled monolayer including at least one of a —$NH_2$ functional group or a —$SH_2$ functional group.

16. The method of claim 13, wherein the forming of both the first region and the second region includes forming, on the surface of the substrate in the second region, a second material layer having a weak adhesive force with respect to the 2D material.

17. The method of claim 16, wherein the 2D material layer comprises at least one of graphene, black phosphorous, or a transition-metal dichalcogenide.

18. The method of claim 17, wherein the second material layer comprises at least one of Si, $SiO_2$, or $Al_2O_3$.

19. The method of claim 17, wherein the second material layer comprises a self-assembled monolayer including at least one of a —$CF_3$ functional group or a —$CH_3$ functional group.

20. The method of claim 13, wherein the physical removal method comprises one of sonication or mechanical detachment.

* * * * *